United States Patent
Deng et al.

(10) Patent No.: US 11,051,408 B2
(45) Date of Patent: Jun. 29, 2021

(54) FIXING DEVICE

(71) Applicants: Tyco Electronics (Shanghai) Co. Ltd., Shanghai (CN); Measurement Specialities (Chengdu) Ltd., Chendu (CN); TE Connectivity Corporation, Berwyn, PA (US)

(72) Inventors: Yingcong Deng, Shanghai (CN); Lan Gong, Shanghai (CN); Qian Ying, Shanghai (CN); Dandan Zhang, Shanghai (CN); Lvhai Hu, Shanghai (CN); Yun Liu, Shanghai (CN); Qinglong Zeng, Shanghai (CN); Yong Yan, Shanghai (CN); Roberto Francisco-Yi Lu, Shanghai (CN)

(73) Assignees: Tyco Electronics (Shanghai) Co. Ltd. TE, Shanghai (CN); Connectivity Corporation, Berwyn, PA (US); Measurement Specialties (Chengdu) Ltd., Chengdu (CN)

( * ) Notice: Subject to any disclaimer, the term of this patent is extended or adjusted under 35 U.S.C. 154(b) by 445 days.

(21) Appl. No.: 15/867,934

(22) Filed: Jan. 11, 2018

(65) Prior Publication Data
US 2018/0206343 A1    Jul. 19, 2018

(30) Foreign Application Priority Data
Jan. 13, 2017    (CN) .......................... 201710025048.1

(51) Int. Cl.
*H05K 3/32* (2006.01)
*B25B 5/12* (2006.01)
*B25B 5/04* (2006.01)
*B25B 5/06* (2006.01)
(Continued)

(52) U.S. Cl.
CPC ................. *H05K 3/32* (2013.01); *B25B 5/04* (2013.01); *B25B 5/06* (2013.01); *B25B 5/12* (2013.01); *B25B 5/147* (2013.01); *B25B 5/163* (2013.01); *H05K 2203/167* (2013.01)

(58) Field of Classification Search
CPC .. B25B 5/12; B25B 5/16; B25B 5/166; B25B 5/04; H05K 2203/167; H05K 3/325
See application file for complete search history.

(56) References Cited

U.S. PATENT DOCUMENTS

| | | | | |
|---|---|---|---|---|
| 3,742,807 A | * | 7/1973 | Manning | F16B 21/086 269/48.2 |
| 4,040,179 A | * | 8/1977 | Sanchez | H01R 43/015 29/749 |

(Continued)

OTHER PUBLICATIONS

Merriam-Webster Thesaurus of "cable" (Year: 2015).*

*Primary Examiner* — Tyrone V Hall, Jr.
*Assistant Examiner* — Makena S Markman
(74) *Attorney, Agent, or Firm* — Barley Snyder

(57) ABSTRACT

A fixing device adapted to fix at least one needle-shaped member comprises a fixing base and a fixing mechanism. The fixing base has at least one positioning groove disposed at a front end of the fixing base. The needle-shaped member is adapted to be positioned in the positioning groove. The fixing mechanism has at least one pressing protrusion at a front end of the fixing mechanism. The pressing protrusion is adapted to press and hold the needle-shaped member in the positioning groove.

21 Claims, 2 Drawing Sheets

(51) Int. Cl.
*B25B 5/16* (2006.01)
*B25B 5/14* (2006.01)

(56) References Cited

U.S. PATENT DOCUMENTS

| | | | | |
|---|---|---|---|---|
| 4,108,589 | A | * | 8/1978 | Bunch .................. B21D 19/046 269/228 |
| 5,040,288 | A | * | 8/1991 | Nilsson ................ H01R 43/042 29/751 |
| 5,307,553 | A | * | 5/1994 | Frohlich .............. H01R 43/045 29/566.2 |
| 6,003,851 | A | * | 12/1999 | Araki ................... H01R 43/005 269/228 |
| 2010/0109223 | A1 | * | 5/2010 | Mills ........................ B25B 5/04 269/207 |

* cited by examiner

FIXING DEVICE

CROSS-REFERENCE TO RELATED APPLICATION

This application claims the benefit of the filing date under 35 U.S.C. § 119(a)-(d) of Chinese Patent Application No. 2017/10025048.1, filed on Jan. 13, 2017.

FIELD OF THE INVENTION

The present invention relates to a fixing device and, more particularly, to a fixing device adapted to fix a needle-shaped member.

BACKGROUND

In electronic manufacturing, for example in a process of soldering a conductive terminal to a pad on a circuit board, it is often necessary to solder a needle-shaped member such as an elongated lead wire. In order to ensure soldering precision, the wire must be precisely positioned and fixed at a predetermined position.

No fixing device in the prior art is adapted to precisely position and fix a needle-shaped member for soldering. The needle-shaped member is usually manually positioned and fixed, reducing the soldering precision and reducing the quality of a resulting soldered product.

SUMMARY

A fixing device adapted to fix at least one needle-shaped member comprises a fixing base and a fixing mechanism. The fixing base has at least one positioning groove disposed at a front end of the fixing base. The needle-shaped member is adapted to be positioned in the positioning groove. The fixing mechanism has at least one pressing protrusion at a front end of the fixing mechanism. The pressing protrusion is adapted to press and hold the needle-shaped member in the positioning groove.

BRIEF DESCRIPTION OF THE DRAWINGS

The invention will now be described by way of example with reference to the accompanying Figures, of which.

DETAILED DESCRIPTION OF THE EMBODIMENT(S)

Figure 1:
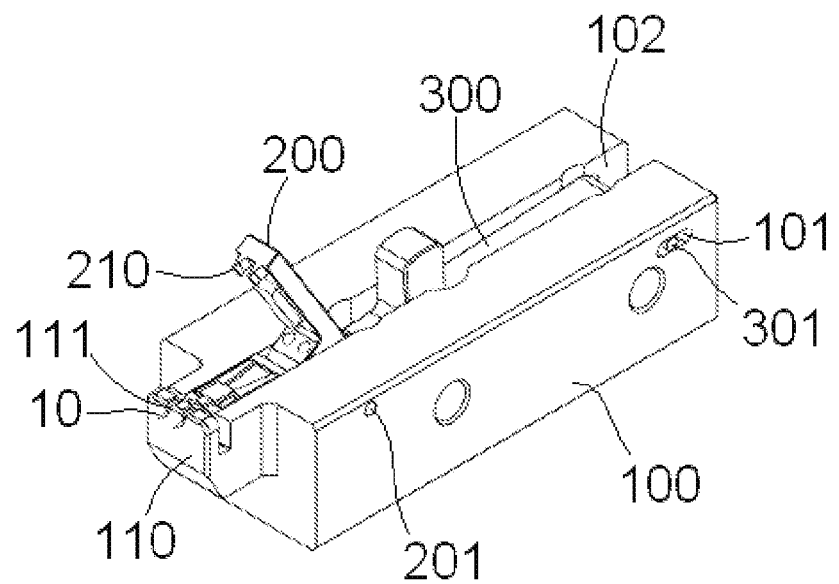
FIG. 1 is a perspective view of a fixing device according to the invention with a first link of the fixing device in an open state.

Embodiments of the present invention will be described hereinafter in detail with reference to the attached drawings, wherein like reference numerals refer to the like elements. The present invention may, however, be embodied in many different forms and should not be construed as being limited to the embodiments set forth herein; rather, these embodiments are provided so that the disclosure will be thorough and complete and will fully convey the concept of the invention to those skilled in the art.

A fixing device according to the invention is shown in FIGS. 1-4. The fixing device is adapted to precisely position and reliably fix a needle-shaped member 10.

The fixing device, as shown in FIGS. 1-4, comprises a fixing base 100 having at least one positioning groove 111 at a front end thereof and a fixing mechanism 200, 300 formed with at least one pressing protrusion 210 at a front end thereof. The needle-shaped member 10 is positioned in the positioning groove 111 and the pressing protrusion 210 is adapted to press and hold the needle-shaped member 10 in the positioning groove 111. In this way, it is possible to precisely position and reliably fix the needle-shaped member 10 in the positioning groove 111.

The fixing base 100, as shown in FIGS. 1-4, has a positioning boss 110 protruding forwardly on the front end thereof, in which the positioning groove 111 is formed. In various embodiments, the positioning groove 111 may be V-shaped or semicircular, and the pressing protrusion 210 is shaped and sized to be matched with the shape of the positioning groove 111. In an embodiment, the needle-shaped member 10 is a welding wire such as a lead wire. In other embodiments, the needle-shaped member may be a needle-shaped pin of a chip.

Figure 2:
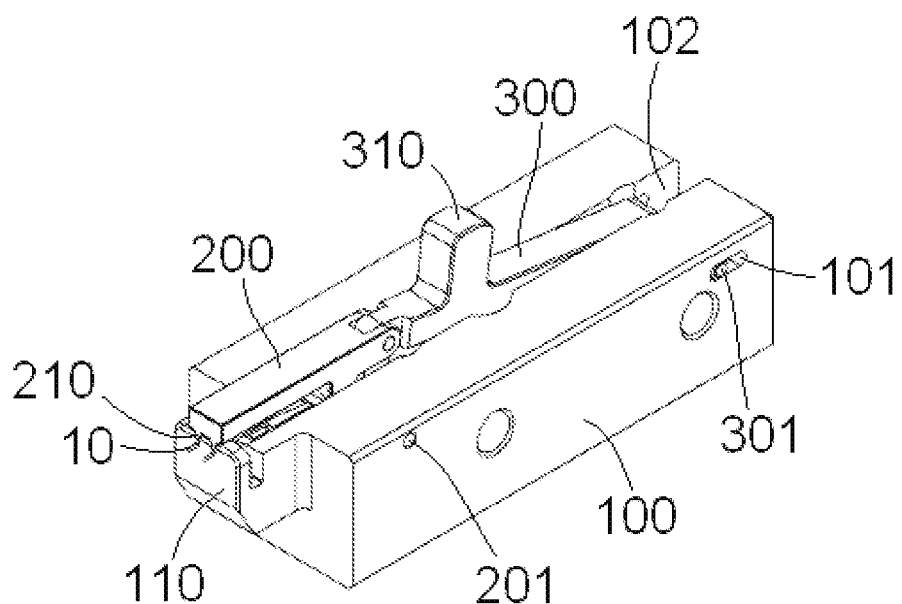
FIG. 2 is a perspective view of the fixing device with the first link in a closed state.
Figure 3:
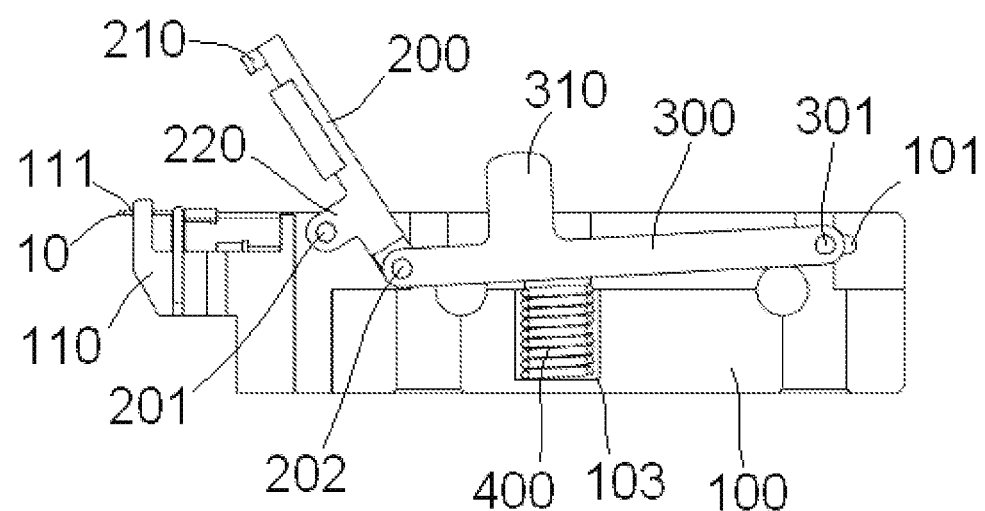
FIG. 3 is a sectional view of the fixing device with the first link in the open state.

The fixing base 100, as shown in FIGS. 1 and 2, has a receiving groove 102 receiving the fixing mechanism 200, 300. The fixing mechanism 200, 300, as shown in FIGS. 1-4, comprises a first link 200, a second link 300 pivotally and slidably connected to a rear end of the fixing base 100, and a connection portion 220 pivotally connected to the fixing base 100 between the rear end of the fixing base 100 and an opposite front end of the fixing base 100. As shown in FIG. 3, the first link 200 is pivotally connected with a front end of the second link 300, which is positioned at a rear end of the first link 200. The pressing protrusion 210 is formed on a bottom surface of the front end of the first link 200.

Figure 4:
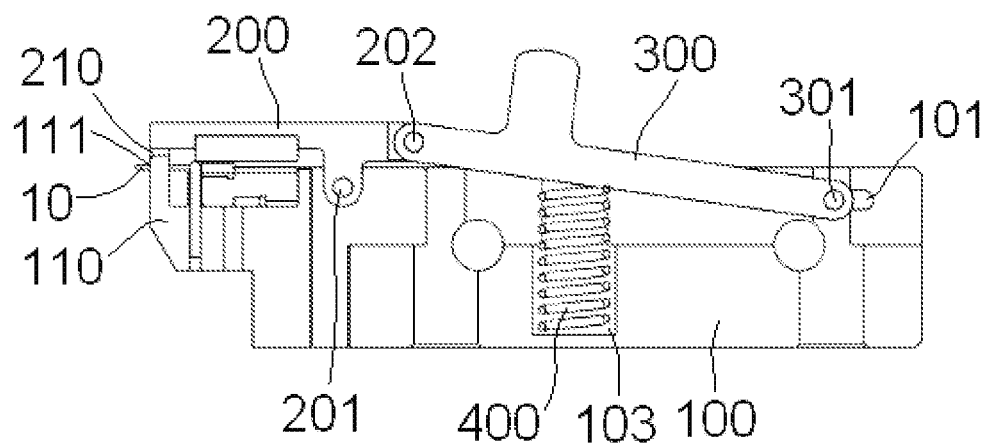
FIG. 4 is a sectional view of the fixing device with the first link in the closed state.

The connection portion 220, as shown in FIGS. 3 and 4, is part of the first link 200 and is positioned between the front and rear ends of the first link 200. The connection portion 220 is pivotally connected with a first pivot shaft 201. The first pivot shaft 201 is pivotally connected to side walls of the receiving groove 102 at both ends of the first pivot shaft 201.

The receiving groove 102 of the fixing base 100 is formed with a sliding slot 101 extending in a front-rear direction in the side walls of the fixing base 100, as shown in FIGS. 1-4. The second link 300 is pivotally connected with a second pivot shaft 301. Both ends of the second pivot shaft 301 are slidably received in the sliding slot 101 of the fixing base 100 at the rear end of the second link 300. The rear end of the first link 200 is pivotally connected with the front end of the second link 300 by a third pivot shaft 202.

As shown in FIGS. 3 and 4, the fixing base 100 has a spring receiving chamber 103 in a bottom of the receiving groove 102. A lower end of a reset spring 400 is disposed in the spring receiving chamber 103. The reset spring 400 has an upper end abutting a lower surface of the second link 300 between the front and rear ends of the second link 300.

The second link 300, as shown in FIG. 2-4, has a pressing head 310 adapted to press the second link 300 downwardly on a top surface thereof. The pressing head 310 is located between the front and rear ends of the second link 300.

The second link 300 is configured to drive the first link 200 to be rotated about the first pivot shaft 201 to an open state, shown in FIGS. 1 and 3, when a downward pressing force is exerted on the pressing head 310. When the downward pressing force is exerted on the pressing head 310, the front end of the second link 300 is moved downwardly and the rear end thereof is rotated about the second pivot shaft 301 and slides forwardly along the sliding slot 101. The rear end of the first link 200 is rotated about the first pivot shaft 201 downwardly and the front end thereof is rotated about the first pivot shaft 201 upwardly so that the first link 200 is rotated to the open state. When the first link 200 is in the open state, the pressing protrusion 210 on the front end of the first link 200 is separated from the positioning groove 111 in the fixing base 100 to allow the needle-shaped member 10 to be arranged in or released from the positioning groove 111.

When the downward pressing force exerted on the pressing head 310 is released, the second link 300 is urged by the reset spring 400 upwardly to drive the first link 200 to be rotated about the first pivot shaft 201 into a closed state shown in FIGS. 2 and 4. When the downward pressing force exerted to the pressing head 310 is released, the front end of the second link 300 is moved upwardly and the rear end thereof is rotated about the second pivot shaft 301 and slides backwardly along the sliding slot 101. The rear end of the first link 200 is rotated about the first pivot shaft 201 upwardly and the front end thereof is rotated about the first pivot shaft 201 downwardly, so that the first link 200 is rotatable to the closed state. When the first link 200 is in the closed state, the pressing protrusion 210 at the front end of the first link 200 is pressed against the positioning groove 111 of the fixing base 100 to press and hold the needle-shaped member 10 in the positioning groove 111.

In the shown embodiment, the fixing base 100 has a plurality of positioning grooves 111 arranged in a row to simultaneously position a plurality of needle-shaped members 10. The first link 200 may be formed with a plurality of pressing protrusions 210 arranged in a row to simultaneously press the plurality of needle-shaped members 10 in place.

What is claimed is:

1. A fixing device adapted to fix at least one needle-shaped member, comprising:
    a fixing base having:
        at least one positioning groove disposed at a front end of the fixing base, the needle-shaped member adapted to be positioned in the positioning groove;
        a receiving groove; and
        a spring receiving chamber;
    a fixing mechanism having:
        at least one pressing protrusion at a front end of the fixing mechanism, the pressing protrusion adapted to press and hold the needle-shaped member in the positioning groove; and
        a first link and a second link, the first link having a connection portion pivotally connected to the fixing base between a front end of the fixing base and a rear end of the fixing base, a rear end of the first link being pivotally connected with a front end of the second link, wherein the pressing protrusion is configured to selectively press and hold the needle shape member in response to motion of the first link, the connection portion disposed between a front end of the first link and the rear end of the first link and pivotally connected to a pair of side walls of the receiving groove, the connection portion arranged within the receiving groove and between the pair of side walls; and
    a reset spring, a lower end of the reset spring disposed in the spring receiving chamber and an upper end of the reset spring abutting a lower surface of the second link, the reset spring biasing the second link upwardly to drive the first link to be rotated into a closed state wherein the pressing protrusion is pressed against the positioning groove.

2. The fixing device of claim 1, wherein the second link is pivotally and slidably connected to the rear end of the fixing base.

3. The fixing device of claim 2, wherein the pressing protrusion is disposed on a bottom surface of the front end of the first link.

4. The fixing device of claim 3, wherein the connection portion is connected with a first pivot shaft to the pair of side walls of the receiving groove.

5. The fixing device of claim 4, wherein the receiving groove has a sliding slot in the pair of side walls and a rear end of the second link is pivotally connected with a second pivot shaft slidably received in the sliding slot, the rear end of the second link arranged within the receiving groove and between the pair of sidewalls.

6. The fixing device of claim 5, wherein the rear end of the first link is pivotally connected with the front end of the second link by a third pivot shaft.

7. The fixing device of claim 6, wherein the spring receiving chamber is defined in a bottom of the receiving groove.

8. The fixing device of claim 7, wherein the second link has a pressing head on a top surface of the second link adapted to press the second link downward.

9. The fixing device of claim 8, wherein the second link drives the first link to be rotated about the first pivot shaft to an open state when a downward pressing force is exerted on the pressing head.

10. The fixing device of claim 9, wherein the pressing protrusion is separated from the positioning groove in the open state.

11. The fixing device of claim 10, wherein the front end of the second link is moved downwardly and the rear end of the second link is rotated about the second pivot shaft and slides along the sliding slot when the downward pressing force is exerted on the pressing head.

12. The fixing device of claim 11, wherein the rear end of the first link is rotated about the first pivot shaft downwardly and the front end of the first link is rotated about the first pivot shaft upwardly when the downward pressing force is exerted on the pressing head.

13. The fixing device of claim 10, wherein the reset spring moves the second link upwardly to drive the first link to be rotated about the first pivot shaft into the closed state when the downward pressing force exerted on the pressing head is released.

14. The fixing device of claim 13, wherein the pressing protrusion holds the needle-shaped member in the positioning groove in the closed state.

15. The fixing device of claim 14, wherein the front end of the second link is moved upwardly and the rear end of the second link is rotated about the second pivot shaft and slides along the sliding slot when the downward pressing force is released.

16. The fixing device of claim 15, wherein the rear end of the first link is rotated about the first pivot shaft upwardly and the front end of the first link is rotated about the first pivot shaft downwardly so that the first link is rotated to the closed state when the downward pressing force is released.

17. The fixing device of claim 1, wherein the fixing base has a positioning boss protruding forwardly on the front end of the fixing base, the positioning groove formed in the positioning boss.

18. The fixing device of claim 1, wherein the fixing base has a plurality of positioning grooves disposed in a row to simultaneously position a plurality of needle-shaped members and the fixing mechanism has a plurality of pressing protrusions arranged in a row to simultaneously press the plurality of needle-shaped members.

19. The fixing device of claim 1, wherein the positioning groove is a V-shaped or semicircular groove and the pressing protrusion is shaped to match the positioning groove.

20. The fixing device of claim 1, wherein the needle-shaped member is a wire.

21. A fixing device adapted to fix at least one needle-shaped member, comprising:
  a fixing base having:
    at least one positioning groove disposed at a front end of the fixing base, the needle-shaped member adapted to be positioned in the positioning groove; and
    a spring receiving chamber;
  a fixing mechanism having:
    a first link defining:
      at least one pressing protrusion on a front end thereof the pressing protrusion adapted to press and hold the needle-shaped member in the positioning groove in response to motion of the first link; and
      a connection portion pivotally connected to the fixing base between a front end of the fixing base and a rear end of the fixing base; and
    a second link having a front end and a rear end fixedly oriented with respect to one another, a rear end of the first link directly pivotally connected with the front end of the second link, and the rear end of the second link directly pivotally and slidably connected to the rear end of the fixing base via a sliding slot; and
  a reset spring, a lower end of the reset spring disposed in the spring receiving chamber and an upper end of the reset spring abutting the second link in an area between the front end and the rear end, the reset spring biasing the second link upwardly to drive the first link to be rotated into a closed state wherein the pressing protrusion is pressed against the positioning groove.

\* \* \* \* \*